(12) United States Patent
Daubenmerkl et al.

(10) Patent No.: US 9,655,260 B2
(45) Date of Patent: May 16, 2017

(54) HOUSING FOR AN ELECTRONIC DEVICE AND ELECTRONIC DEVICE

(71) Applicant: Siemens Aktiengesellschaft, Munich (DE)

(72) Inventors: Christian Daubenmerkl, Hahnbach (DE); Heinrich Schlichting, Wenzenbach (DE); Gerd Webermann, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 14/989,382

(22) Filed: Jan. 6, 2016

(65) Prior Publication Data
US 2016/0212868 A1 Jul. 21, 2016

(30) Foreign Application Priority Data

Jan. 20, 2015 (EP) .................................... 15151821

(51) Int. Cl.
*G06F 1/16* (2006.01)
*H05K 5/02* (2006.01)
*H05K 5/00* (2006.01)

(52) U.S. Cl.
CPC ......... *H05K 5/0217* (2013.01); *H05K 5/0004* (2013.01); *H05K 5/0017* (2013.01); *H05K 5/0086* (2013.01)

(58) Field of Classification Search
CPC ....................................................... G06F 1/16
See application file for complete search history.

(56) References Cited

U.S. PATENT DOCUMENTS

| 5,687,975 | A | * | 11/1997 | Inciong | F02F 7/006 277/591 |
|---|---|---|---|---|---|
| 6,561,522 | B1 | * | 5/2003 | Radelet | F16J 15/021 277/314 |
| 6,779,802 | B2 | * | 8/2004 | Westra | A47L 9/00 277/628 |
| 7,403,837 | B2 | * | 7/2008 | Graiger | G05B 19/409 361/71 |
| 7,748,620 | B2 | * | 7/2010 | Gomez | G06Q 20/00 235/380 |
| 2001/0048585 | A1 | * | 12/2001 | Imsand | G06F 1/16 361/679.09 |
| 2004/0248619 | A1 | | 12/2004 | Graiger et al. | |
| 2005/0141681 | A1 | | 6/2005 | Graiger | |
| 2013/0032371 | A1 | | 2/2013 | Makino | |
| 2015/0028731 | A1 | | 1/2015 | Etlinger | |

FOREIGN PATENT DOCUMENTS

| DE | 199 52 641 A1 | 4/2001 |
|---|---|---|
| DE | 10 2006006386 A1 | 8/2007 |
| DE | 20 2012 100 272 U1 | 4/2012 |
| WO | WO 03/088011 A2 | 10/2003 |

* cited by examiner

*Primary Examiner* — Anthony Q Edwards
(74) *Attorney, Agent, or Firm* — Cozen O'Connor

(57) ABSTRACT

A housing for an electronic device includes a double-walled frame, wherein the double-walled frame substantially includes a first wall and a second wall, where the first wall forms an outer wall here, where the first wall is formed in two parts, where a first wall part of the first wall and a second wall part of the first wall are arranged relative to one another such that with a force acting on the frame from the outside, the first wall part can be shifted over the second wall part by overcoming a frictional force that is present between the two wall parts.

6 Claims, 4 Drawing Sheets

HOUSING FOR AN ELECTRONIC DEVICE AND ELECTRONIC DEVICE

BACKGROUND OF THE INVENTION

1. Field of the Invention

The invention relates to a housing for an electronic device, comprising a double-walled frame, where the frame substantially has a first wall and a second wall, and the first wall here forms an outer wall.

2. Description of the Related Art

Electronic devices, in particular mobile devices, such as mobile control panels for industrial automation or cellphones, which are held in the hand by the operator, must fulfill certain requirements with respect to their ability to withstand being dropped. For instance, the device function must not be impaired after the device has been dropped from a certain height and has hit the floor. These device functions comprise, e.g., the device must still function without restrictions thereafter and the housing must not fracture. SIMATIC HMI, Bediengerät Mobile Panel 277 (WinCC flexible) Betriebsanleitung [HMI device Mobile Panel 277 (WinCC flexible) operating instructions], 08/2008, A5E00355982-02 discloses an electronic device, in particular a mobile panel, in which a fall protection of the device is ensured via a double wall principle. Here, the frame is built from two walls (an outer device wall and an inner device wall), which are disposed at a certain distance from one another. The outer device wall deforms so as to absorb the drop energy upon impact with the floor. The inner wall is thus not impaired and the device functions are preserved.

DE 199 52 641 A1 discloses a protective cover with an impact-absorbing filler, in particular for portable electronic devices.

WO 03/088011 A2 discloses a mobile computing unit and an expansion apparatus for industrial machine control systems, where a frame- or housing-type supporting body is formed as a soft-elastic or impact-damping holster.

SUMMARY OF THE INVENTION

It is the object of the present invention to improve conventional holsters, protective covers or frames in accordance with the double wall principle.

This and other objects and advantages are achieved in accordance with the invention with a housing for an electronic device, comprising a double-walled frame, where the frame substantially has a first wall and a second wall, with the first wall here forming an outer wall, where the first wall is formed in two parts, where a first wall part of the first wall and a second wall part of the first wall are arranged relative to one another such that, with a force acting on the frame from the outside, the first wall part can be shifted over the second wall part by overcoming a frictional force that is present between the two wall parts.

The present invention is a further development of the above-described double wall principle. In accordance with the invention, the drop energy is now not only absorbed by deforming the device outer wall but, instead, also by frictional energy that occurs if the first wall part and the second wall part of the outer wall slide over one another during a deformation. On account of forming the outer wall in two part-walls, which are arranged so as to overlap in a certain region so that in the event of a deformation they can slide over one another by overcoming a friction force, the following advantages or technical effects are achieved.

A distance between the first wall and the second wall (outer device wall and inner device wall) can be reduced with the same energy absorption. As a result, the housing or the electronic devices disposed in the housing can be made smaller and thus it additionally becomes possible to reduce a device weight. Above all, the device weight plays an important role in mobile devices with respect to ease of use. Moreover, a higher energy absorption can be permitted in the case of the same distance between the two walls (outer device wall and inner device wall). As a result, it becomes possible to increase the maximum permitted drop height.

With the housings or devices provided with the conventional double wall principle, it is further disadvantageous that by deforming an upper device cover and a lower device cover, a gap may form between the two covers. Since the device is held in the hand, this gap may become unpleasantly noticeable in the hand for a user. Here, moreover, it is disadvantageous that dirt is able to accumulate in this gap. It is also disadvantageous if water is able to enter the intermediate space between the first wall and the second wall through this existing gap. However, since the outer wall, i.e., the first wall, is now formed such that there is a two-part frame, e.g., an upper and a lower cover that are not flush with one another, but where the upper cover overlaps the lower cover, a gap is no longer present.

In a preferred embodiment, the first wall part of the first wall and the second wall part of the first wall are arranged at an obtuse angle relative to one another. The frictional force between the two wall parts can be set by selecting the angle to be from greater than 90° C. to less than 180° C.

To install the electric device in the housing, it is advantageous if the frame has an upper part and a lower part, which are formed so that they can be assembled into a single unit.

With respect to an increased requirement for protection against splashing or for leak-tightness in the event of temporary immersion (IP 65), an intermediate element is preferably arranged between the upper part and the lower part such that it is disposed between a first wall part of the second wall and a second wall part of the second wall. Here, the intermediate element assumes, on the one hand, a sealing function and, on the other hand, a stabilizing function for the second wall or the inner wall that is also divided into two.

With respect to the stabilization of the second wall, the intermediate element is formed such that it has a first assembly frame and a second assembly frame, which extend in parallel to one another, and an auxiliary frame. The two parallel assembly frames form a groove with a sealing surface.

In a further embodiment of the housing, the frame has a recess for a control element and a protective collar is arranged around the control element. If, for example, the control element is an emergency-off switch and if, in the event of the device falling, the device should fall onto the control element emergency-off switch, the protective collar thus prevents unwanted damage to the emergency-off switch.

The housing is advantageously manufactured from impact-resistant plastic.

It is also an object of the invention to provide an electronic device having a housing that minimizes the device weight or maximizes a permissible drop height.

The electronic device is preferably formed as a portable control unit that is protected against impact and shock.

Other objects and features of the present invention will become apparent from the following detailed description considered in conjunction with the accompanying drawings.

It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing shows an exemplary embodiment of a housing with an electronic device, in which.

DETAILED DESCRIPTION OF THE EXEMPLARY EMBODIMENTS

Figure 1:
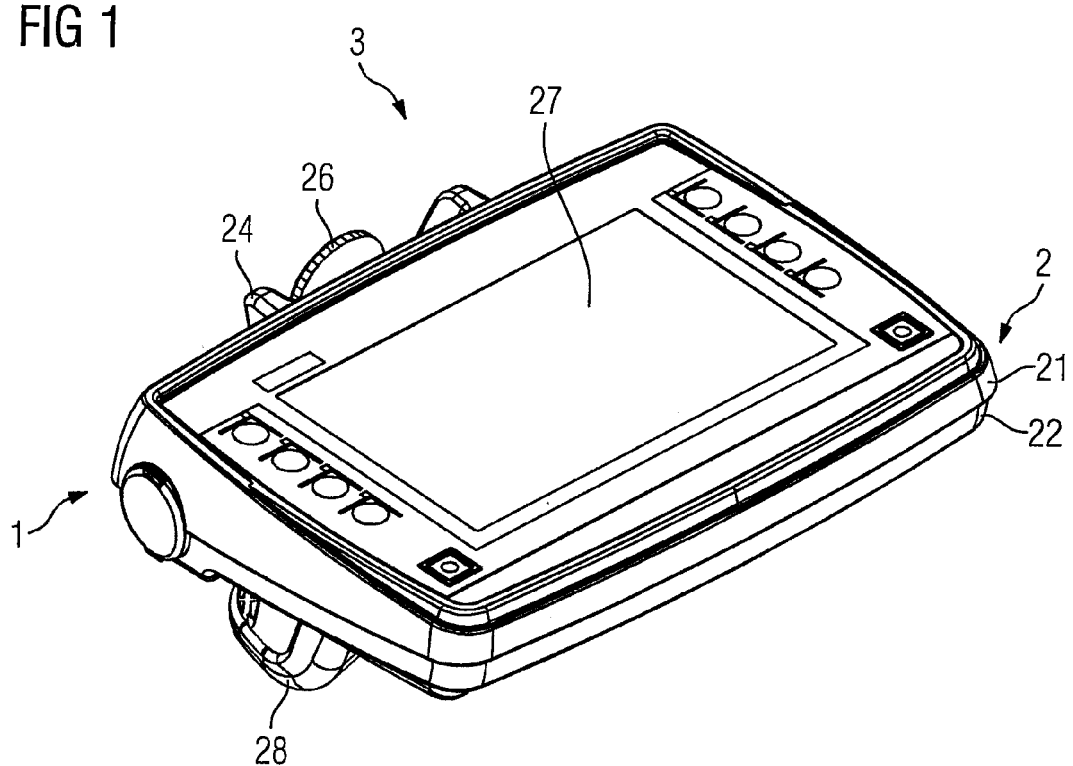
FIG. 1 shows a perspective view of the electronic device in accordance with the invention.

With reference to FIG. 1, an industrial human machine interface (HMI) device formed as a mobile panel with a touch screen 27 is shown in a perspective representation. Here, the mobile panel as an electronic device 3 has a housing 1 with a frame 2. In turn, the frame 2 has an upper part 21 and a lower part 22, which are formed so that they can be assembled into a single unit. In order to securely hold the mobile panel in the hand of a user, the mobile panel has a carrying handle 28 on the underside of the device. A control element 26 comprising an emergency-off switch is arranged in a front side of the mobile panel. To ensure that the emergency-off switch is not triggered unintentionally when the device 3 drops to the floor, for instance, a protective collar 24, is arranged around the emergency-off switch.

Since a mobile panel, particularly for industrial automation technology, is exposed to increased environmental demands, the mobile panel is formed as a portable HMI device that is protected against impact and shock.

Figure 2:
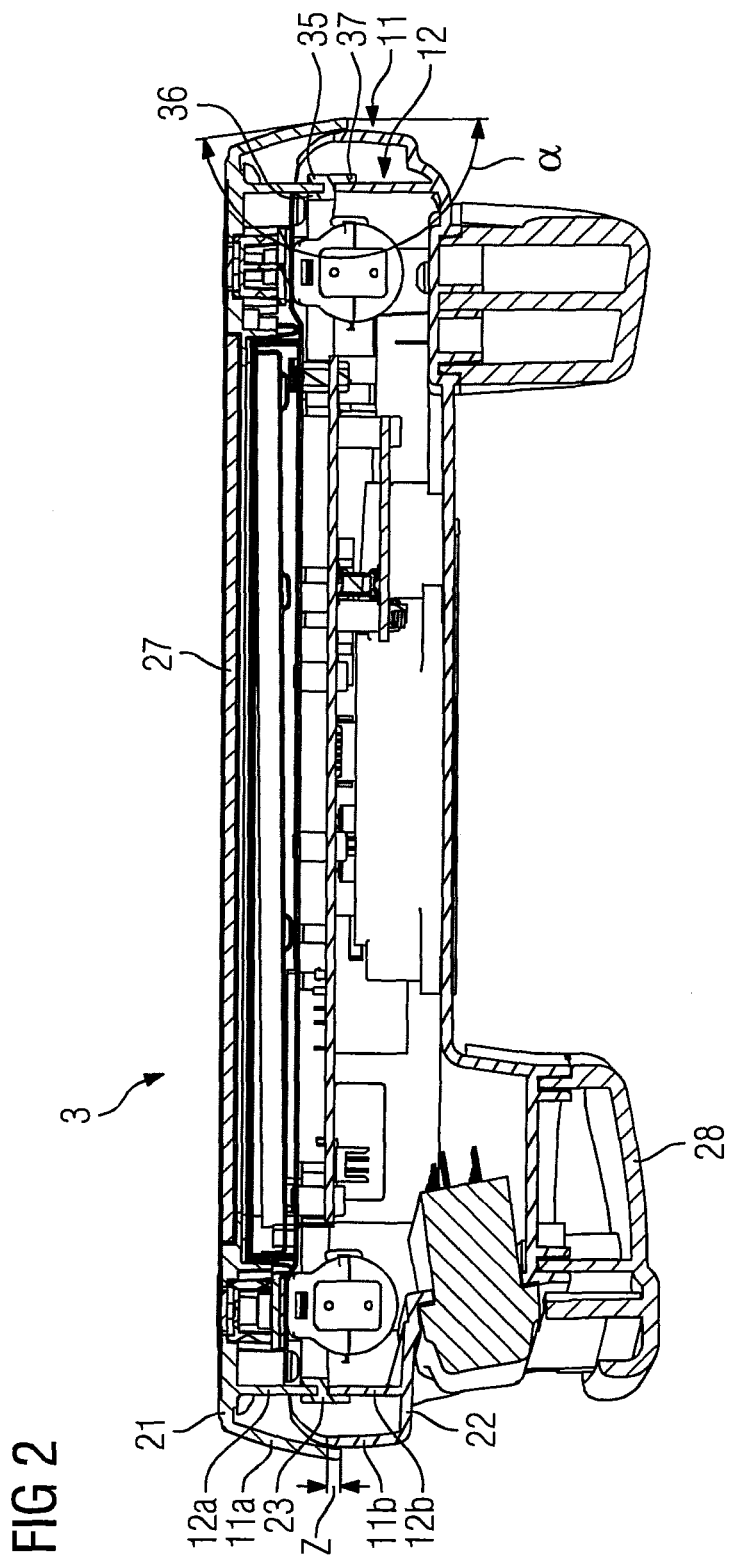
FIG. 2 shows sectional view of the electronic device in accordance with the invention.

FIG. 2 shows a sectional representation of the electronic device 3 of FIG. 1. The frame 2 of the housing 1 is formed as a double-walled frame 2 that extends around the entire device 3. Here, the frame 2 substantially has a first wall 11 and a second wall 12, where the first wall 11 forms an outer wall here. The first wall 11 is formed in two parts, where a first wall part 11a of the first wall 11 and a second wall part 11b of the first wall 11 are arranged relative to one another such that with a force F acting on the frame 2 from the outside, the first wall part 11a can be shifted over the second wall part 11b by overcoming a frictional force FR that is present between the two wall parts 11a, 11b (see also FIG. 6). The first wall part 11a is a component of an upper part 21 and the second wall part 11b is a component of a lower part 22.

To ensure that a shock load acting on the frame 2 can be absorbed as effectively as possible, the first wall part 11a of the first wall 11 and the second wall part 11b of the first wall 11 are arranged at an obtuse angle α relative to one another.

The first wall 11 with its overlapping wall parts 11a, 11b forms the improved double wall principle. The second wall is also divided into a first wall part 12a of the second wall 12 and into a second wall part 12b of the second wall 12. As a result, an intermediate element 23 is arranged between the first wall part 12a of the second wall 12 and the second wall part 12b of the second wall 12.

Figure 5:
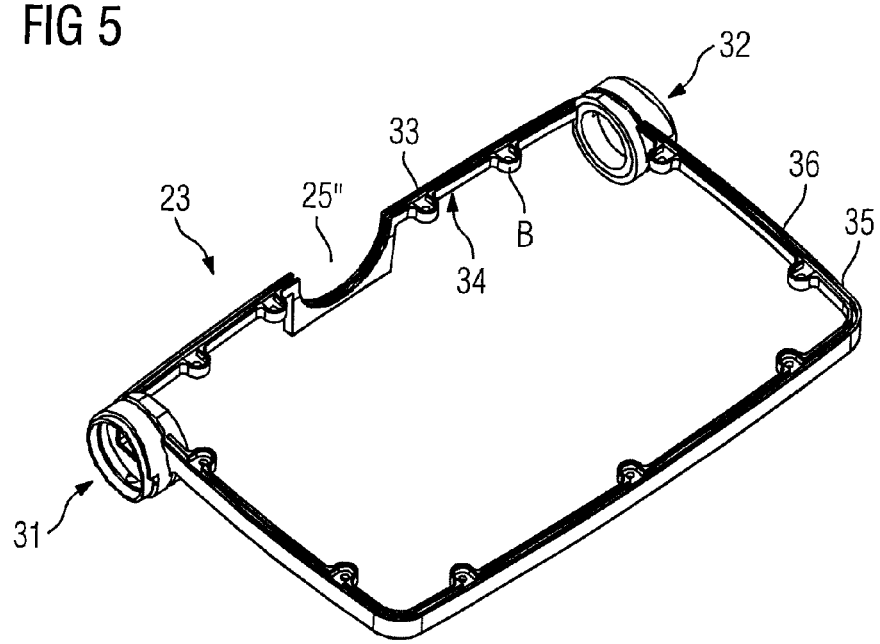
FIG. 5 shows an intermediate element in accordance with the invention.

The intermediate element 23 has an n-shape, where a first assembly frame 36 extends, as a result of which a first groove 33 is formed (see also FIG. 5). The first wall part 12a of the second wall 12 is arranged in the first groove 33 and the second wall part 12b of the second wall 12 is arranged in the second groove. The intermediate element 23 thus assumes the function of a seal. A sealing surface that presses on the first wall part 12a and provides a seal is formed in the first groove 33. An auxiliary frame 37 forms a second groove 34 with a further sealing surface upon which the second wall part 12b of the second wall 12 presses and provides a seal.

The first wall part 11a of the first wall 11 and the second wall part 11b of the first wall 11 overlap in an overlapping zone Z. As a result, the first wall IIIs also already formed with a certain sealing functionality.

Figure 3:
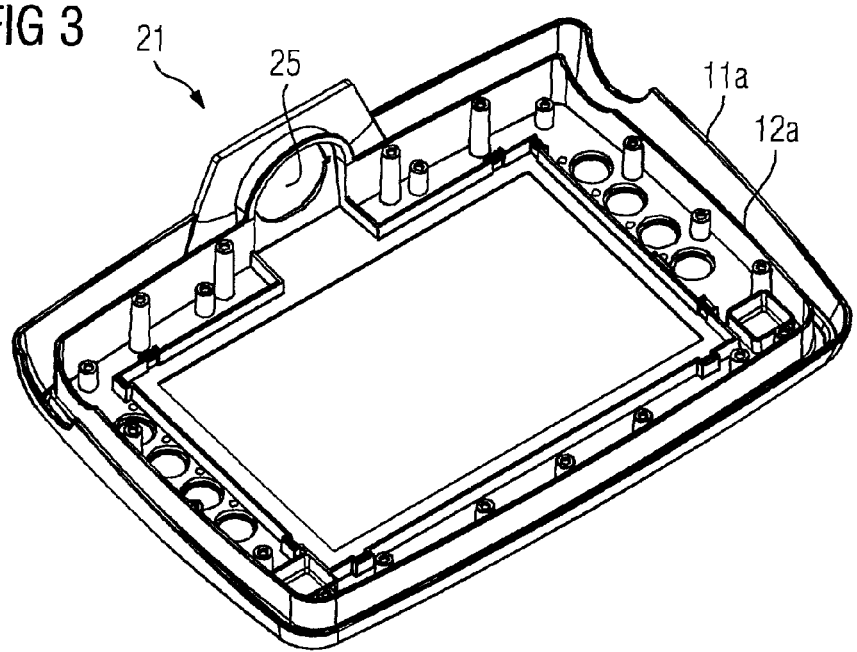
FIG. 3 shows an illustration of an upper part of the housing or an upper cover in accordance with the invention.

FIG. 3 shows a perspective view of the upper part 21 of the housing 1.

Figure 4:
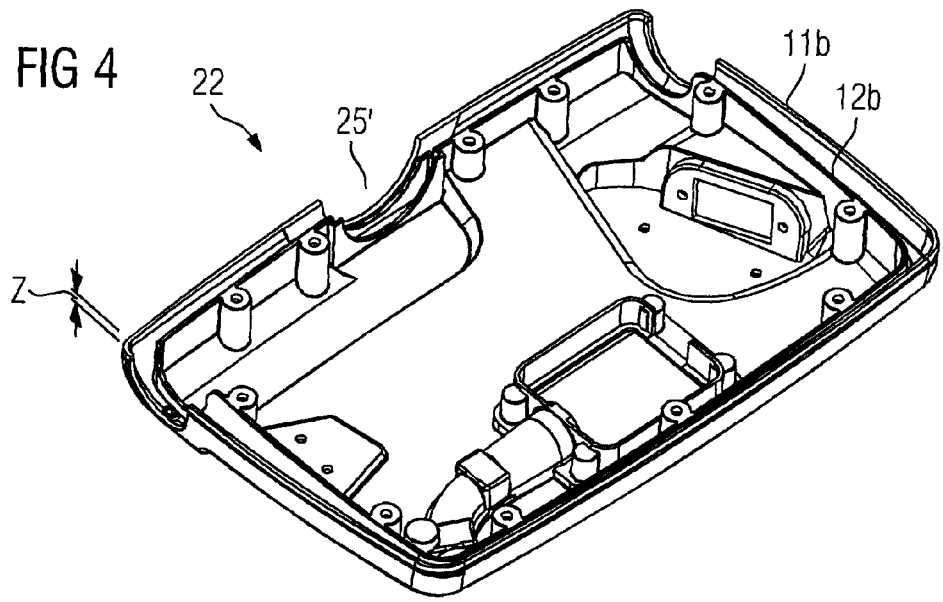
FIG. 4 shows an illustration of a lower part of the housing or a lower cover in accordance with the invention.

FIG. 4 shows the lower part 22 of the housing 1 associated with the upper part 21 likewise in a perspective view. If the upper part 21 and the lower part 22 are joined together, then the first wall part 11a of the first wall 11 overlaps the overlapping zone Z of the second wall part 11b of the first wall 11 of the lower part 23.

The upper part 21 has a recess 25 for receiving a control element 26, in particular for receiving an emergency-off switch. The lower part 22 has a correspondingly adjusted further recess 25'.

The intermediate element 23 is likewise shown in a perspective view in FIG. 5. In an adjustment for the recess 25, the intermediate element 23 likewise has an arched adjusted recess 25". The intermediate element 23 is formed as a type of sealing frame, where the first wall part 12a of the second wall 12 is arranged in a first groove 33 and the second wall part 12b of the second wall 12 is arranged in the second groove 34. In order to introduce possible interfaces into the electronic device 3, the intermediate element 23 has a first access 31 and a second access 32. The accesses 31, 32 are formed as a tunnel through which a USB connection or another type of interface in the electronic device for instance can be reached. The first access 31 can be closed in a water-tight manner with a sealing cap.

Figure 6:
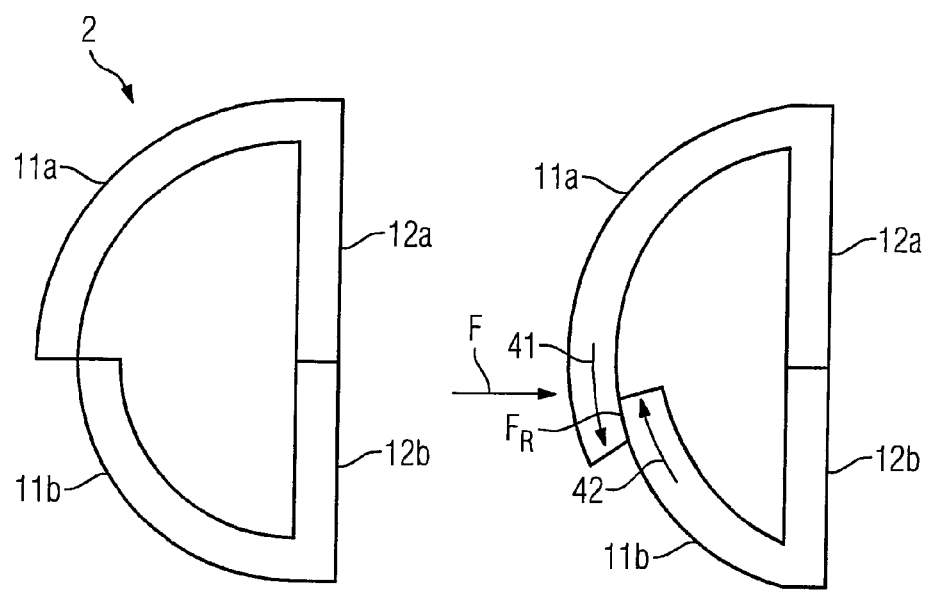
FIG. 6 shows a block diagram of the mode of operation of the double wall principle as improved in accordance with the invention.

With reference to FIG. 6, the mode of operation of the improved double wall principle using a frictional force $F_R$ that occurs is shown with reference to a two-part schematic diagram. The left figure shows the schematic section through the frame 2 with the first wall part 11a of the first wall 11 and the second wall part 11b of the first wall 11 in a basic position or in a rest position.

The right illustration shows a configuration in the event of the frame 2 being impacted, for instance, on the floor. As a result of the force F acting on the first wall part 11a of the first wall 11, the first wall part 11a executes a relative movement 41, as a result of which the first wall part 11a and the second wall part 11b slide over one another. A frictional force $F_R$ is present between the two wall parts 11a and 11b. Accordingly, the two outer walls 11a, 11b rub against one another and additional energy can be absorbed by overcoming the friction force $F_R$.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A housing for an electronic device, comprising:
   a double-walled frame comprising a first wall and a second wall, the first wall forming an outer wall;
   wherein the first wall forms two parts;
   wherein a first wall part of the first wall and a second wall part of the first wall are arranged relative to one another such that with a force acting from outside on the double-walled frame, the first wall part is shifted over the second wall part by overcoming a frictional force that is present between the first wall part and the second wall part, the housing further comprising:
   an intermediate element arranged between an upper part and a lower part such that said intermediate element is disposed between a first wall part of the second wall and a second wall part of the second wall;
   wherein the double-walled frame includes the upper part and the lower part, the upper part and lower parts being configured to assemble into a single unit; and
   wherein the intermediate element includes a first assembly frame, a second assembly frame and an auxiliary frame, said first and second assembly frames extending parallel to one another.

2. The housing as claimed in claim 1, wherein the first wall part of the first wall and the second wall part of the first wall are arranged at an obtuse angle ($\alpha$) relative to one another.

3. The housing as claimed in claim 1, wherein the double-walled frame includes a recess for a control element and a protective collar is arranged around the control element.

4. The housing as claimed in claim 1, wherein the housing is made from impact-resistant plastic.

5. The housing of claim 1, wherein the housing is arranged in an electronic device.

6. The housing as claimed in claim 5, wherein the electronic device comprises a portable control unit which is protected against impact and shock.

* * * * *